United States Patent
Keller

(12) United States Patent
(75) Inventor: Rex W. Keller, Glendale, AZ (US)
(73) Assignee: FCI Americas Technology, Inc., Reno, NV (US)
(*) Notice: Subject to any disclaimer, the term of this patent is extended or adjusted under 35 U.S.C. 154(b) by 0 days.

(10) Patent No.: US 6,830,463 B2
(45) Date of Patent: Dec. 14, 2004

(54) BALL GRID ARRAY CONNECTION DEVICE

(21) Appl. No.: 10/059,461
(22) Filed: Jan. 29, 2002
(65) Prior Publication Data
US 2003/0143872 A1 Jul. 31, 2003

(51) Int. Cl.⁷ ............................................. H01R 12/00
(52) U.S. Cl. ........................................... 439/71; 439/91
(58) Field of Search ........................... 439/71, 70, 68, 439/65, 55, 66, 91, 591, 525, 83; 228/180.2, 180.21, 180.22; 29/840; 361/767, 768, 771, 803; 757/787, 788, 728; 174/263, 264

(56) References Cited

U.S. PATENT DOCUMENTS

| | | | |
|---|---|---|---|
| 4,774,632 A | 9/1988 | Neugebauer | 361/386 |
| 4,836,435 A * | 6/1989 | Napp et al. | 228/180.22 |
| 4,912,545 A | 3/1990 | Go | 357/67 |
| 5,329,423 A | 7/1994 | Scholz | 361/760 |
| 5,435,733 A | 7/1995 | Chernicky et al. | 439/68 |
| 5,477,933 A | 12/1995 | Nguyen | 174/262 |
| 5,577,944 A | 11/1996 | Taylor | 445/25 |
| 5,593,322 A * | 1/1997 | Swamy et al. | 439/660 |
| 5,691,041 A * | 11/1997 | Frankeny et al. | 428/209 |
| 5,738,531 A | 4/1998 | Beaman et al. | 439/71 |
| 5,800,184 A * | 9/1998 | Lopergolo et al. | 439/66 |
| 5,829,988 A | 11/1998 | McMillan et al. | 439/70 |
| 6,024,584 A | 2/2000 | Lemke et al. | 439/83 |
| 6,050,832 A * | 4/2000 | Lee et al. | 439/91 |
| 6,084,782 A * | 7/2000 | Huynh et al. | 361/777 |
| 6,097,609 A | 8/2000 | Kabadi | 361/760 |
| 6,155,860 A | 12/2000 | Lemke et al. | 439/341 |
| 6,354,844 B1 * | 3/2002 | Coico et al. | 439/66 |
| 6,414,248 B1 * | 7/2002 | Sundstrom | 174/260 |

FOREIGN PATENT DOCUMENTS

EP 0 588 609 A1 3/1994

OTHER PUBLICATIONS

Delphi Automotive Systems, Gold Dot Technology, "The Difference is in the Dot", www.golddot.com, www.delphi-auto.com, 7 pages.

* cited by examiner

Primary Examiner—Gary Paumen
Assistant Examiner—Edwin A. Leon
(74) Attorney, Agent, or Firm—Woodcock Washburn LLP

(57) ABSTRACT

The invention includes an interposer, BGA connector, or other connection device that provides electrical contact with a ball grid array connector. The inventive interposer includes a housing with contacts. The contacts have a first end and a second end. The interposer also includes a first body and a second body of reflowable, electrically conductive material disposed on the first end of at least one of the contacts. The first body and the second body provide an electrical contact between the interposer and a single body of reflowable, electrically conductive material of the ball grid array connector.

26 Claims, 8 Drawing Sheets

BALL GRID ARRAY CONNECTION DEVICE

FIELD OF THE INVENTION

The invention relates to the field of electrical connectors. More specifically, the invention relates to an interposer for connecting a ball grid array to a substrate.

BACKGROUND OF THE INVENTION

The recent drive for smaller, more functional electronic equipment has created an ongoing need for miniaturization of all components, especially electrical connectors. The drive for smaller electronic equipment has also been accompanied by a recent preference for surface mount techniques (SMT) for mounting components on circuit boards. To satisfy the need for increased terminal density in SMT, array connectors have been created. In particular, as described in U.S. Pat. No. 6,024,584, entitled "High Density Connector," and incorporated herein by reference, ball grid array (BGA) connectors have become a reliable and efficient technique for mounting high-density electrical connectors on substrates using SMT.

BGA connectors have an insulative connector housing. One side of the connector housing are a matrix of spherical solder balls positioned to engage the conductive paths of a circuit substrate. The opposite side of the connector housing has a corresponding matrix of contact terminals, which extend through the connector housing and connect electrically to the solder balls. These contact terminals are designed to engage another BGA connector, similarly connected to another substrate, thus permitting board-to-board interconnection via the BGA connector device. The connection between the BGA and the circuit substrates is accomplished by a process called "reflow." In the reflow process, the solder balls are heated until they begin to melt and then cooled such a soldered connection is made between the BGA and the substrate. Because the circuit substrate typically is a flat surface with etched circuits, the solder balls substantially maintain their position during the reflow process.

Often, when using the BGA to interconnect circuit substrates, an interposer also is used. An interposer is an intermediate connection device that may be placed between the BGA connector and the circuit substrate. By using an interposer to connect and disconnect the BGA and the circuit substrate, wear on the BGA connector and substrate's etched circuit interface is reduced. Also, the interposer may provide an alternative connection means with the substrate. Unlike the substrate interface, however, the interposer may not provide a flat mating surface for the BGA's solder balls. For example, the interposer also may be an array of solder balls, similar to the BGA connector. As a result, during the reflow process the BGA-to-interposer connection may shift, causing improper connection. Interposers also allow for better heat absorption and heat transfer away from delicate electronic circuit elements by keeping the heat within the interposer.

Therefore, there is a need to provide an interposer, BGA connector, or other connection device that can more easily mate with the BGA connector or other similar connector.

SUMMARY OF THE INVENTION

The invention includes an interposer, BGA connector, or other connection device that provides electrical contact with a ball grid array connector. The inventive interposer includes a housing with contacts. The contacts have a first end and a second end. The interposer also includes a first body and a second body of reflowable, electrically conductive material disposed on the first end of at least one of the contacts. The first body and the second body provide an electrical contact between the interposer and a single body of reflowable, electrically conductive material of the ball grid array connector. The contacts may pass from a first face of the housing to a second face of the housing opposite the first face, such that the first end of the contacts are accessible on a first face of the housing and the second end of the contacts are accessible on an opposite face of the housing. The first body and the second body of the interposer form a soldered connection with the single body of reflowable, electrically conductive material of the ball grid array connector during a reflow process. The interposer also may include a third body of reflowable, electrically conductive material disposed on the first end of at least one of the contacts, where the third body provides electrical contact between the interposer and the single body of reflowable, electrically conductive material of the ball grid array connector, and provides a soldered connection with the ball grid array connector during a reflow process. One or more of the bodies may be substantially spherical and/or substantially conical, and may have substantially similar dimensions.

BRIEF DESCRIPTION OF THE DRAWINGS

Other uses and advantages of the invention will become apparent to those skilled in the art upon reference to the specification and the drawings, in which.

DETAILED DESCRIPTION OF THE PREFERRED EMBODIMENT

Figure 1:
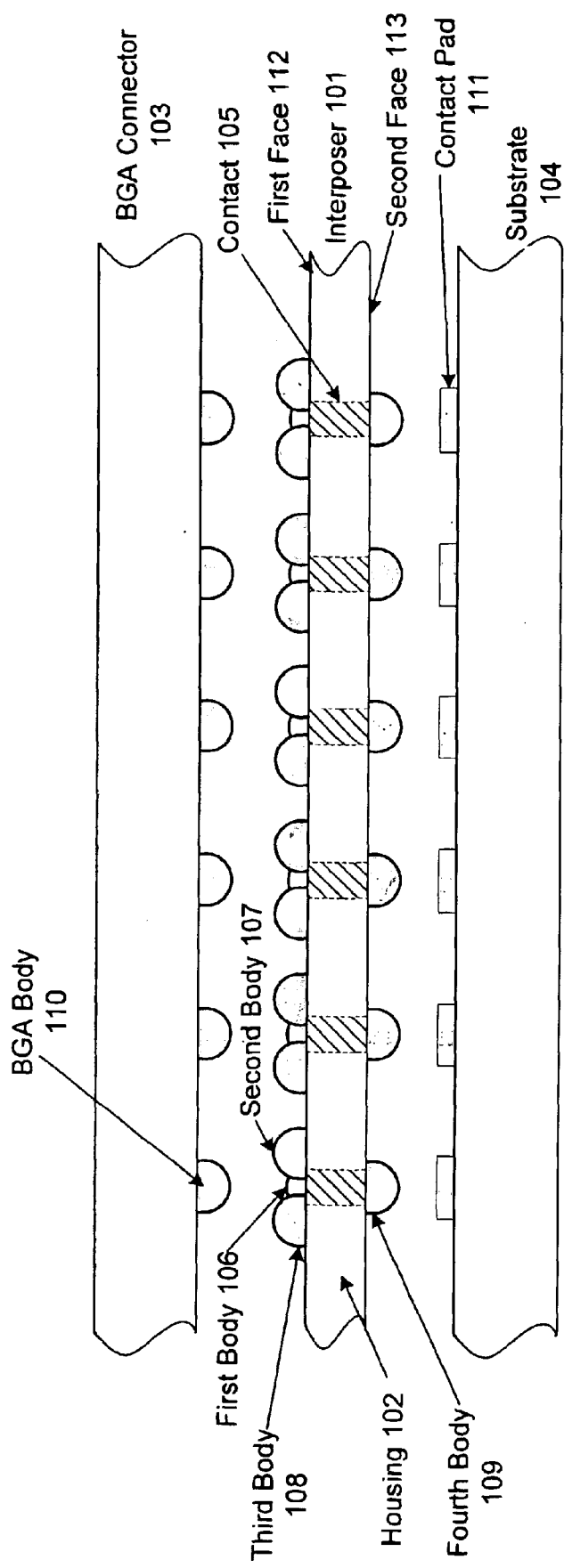
FIG. 1 is a side view of an interposer for a ball grid array connector, according to the invention.

FIG. 1 is a side view of an exemplary interposer 101 that provides an electrical contact with a ball grid array (BGA) connector 103. Although FIG. 1 is described in the context of an interposer, it should be appreciated that the invention equally applies to other types of connection devices including, for example, other BGA connectors. Accordingly, the invention is not limited to an interposer or to another BGA connector.

As shown in FIG. 1, interposer 101 may be adapted to provide electrical contact with a BGA connector 103 and with a substrate 104. Interposer 101 includes a housing 102. Housing 102 has a first face 112 and a second face 113. First face 112 may be used to provide electrical contact with BGA connector 103. Second face 113 may be adapted to provide electrical contact with substrate 104.

First face 112 on housing 102 includes a plurality of reflowable, electrically conductive material or balls disposed thereon for providing connection to BGA connector 103. In particular, first face 112 includes a first body 106, a second body 107, and a third body 108. Also, there may be many groups of such bodies located on first face 112 of housing 102. First body 106, second body 107, and third body 108 may be in close proximity so as to receive a BGA body 110 disposed on BGA connector 103. More specifically, first body 106, second body 107, and third body 108 may be positioned such that BGA body 110 on BGA connector 103 rests on interposer 101. Although a single BGA body is shown in FIG. 1, it should be appreciated that more than one body of the BGA may make contact with the bodies of the interposer.

During a reflow process, BGA body 110 is placed on top of, or adjacent to, first body 106, second body 107, and third body 108. The reflow process heats the bodies such that the reflowable, electrically conductive material begins to melt. As a result of the melting of the material, BGA body 110 makes a soldered contact with at least one of first body 106, second body 107, and third body 108. First body 106, second body 107, and third body 108 may be positioned such that BGA body 110 rests on bodies 106–108 prior to the reflow process. Because first body 106, second body 107, and third body 108 are positioned to permit BGA body 110 to rest thereon, BGA body 110 is prevented from moving prior to and/or during the reflow process. Therefore, BGA body 110 is permitted to make a soldered connection with first body 106, second body 107, and third body 108.

In order to facilitate BGA body 110 resting on first body 106, second body 107, and third body 108, some or all of the bodies may be substantially spherical or substantially conical. Also, BGA body 110 and bodies 106–108 may have substantially similar dimensions to further facilitate proper connection and planar alignment (i.e., planarity). Also, the number of bodies on first face 112 of housing 102 may vary with the number, size, and dimensions of a particular body (e.g., BGA body 110) on BGA connector 103. Accordingly, the invention is not limited to any of such features.

A contact 105 may be in electrical contact with at least one of first body 106, second body 107, and third body 108. Contact 105 has a first end and a second end. First end provides an electrical contact point with first body 106, second body 107, and third body 108. The second end provides an access and electrical contact point with fourth body 109. Contact 105 passes through housing 102 from first face 112 to second face 113. Also, contact 105 is electrical contact with a fourth body 109. As a result, contact 105 may provide an electrical conductor from at least one of first body 106, second body 107, and third body 108 to fourth body 109 through housing 102. Fourth body 109 may be positioned to provide electrical contact with a contact pad 111 on substrate 104. Therefore, during the reflow process fourth body 109 may be positioned adjacent to contact pad 111 so as to provide a soldered connection with contact pad 111 during the reflow process. As a result, interposer 101 provides an electrical connection between BGA connector 103 and substrate 104.

Figure 2:
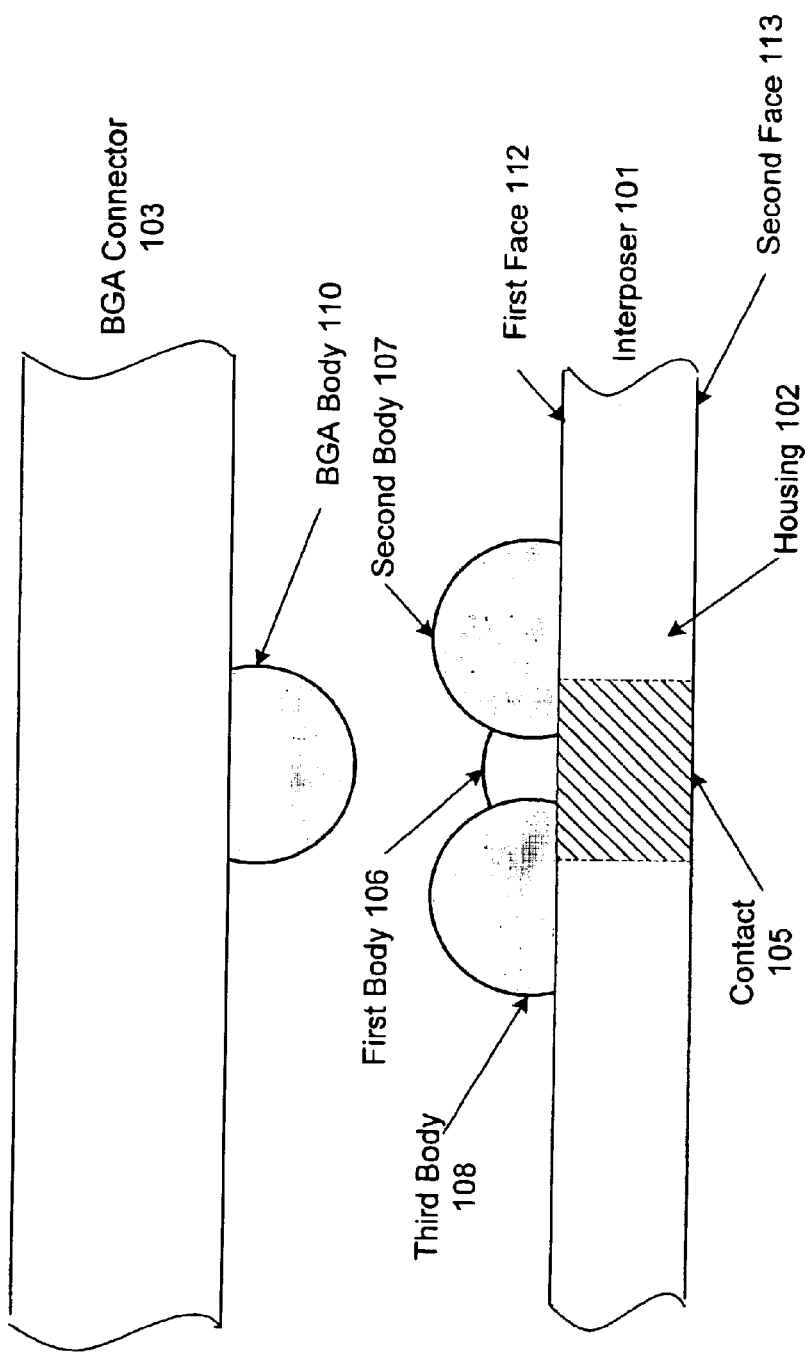
FIG. 2 is an exploded view of the interposer shown in FIG. 1, according to the invention.
Figure 3:
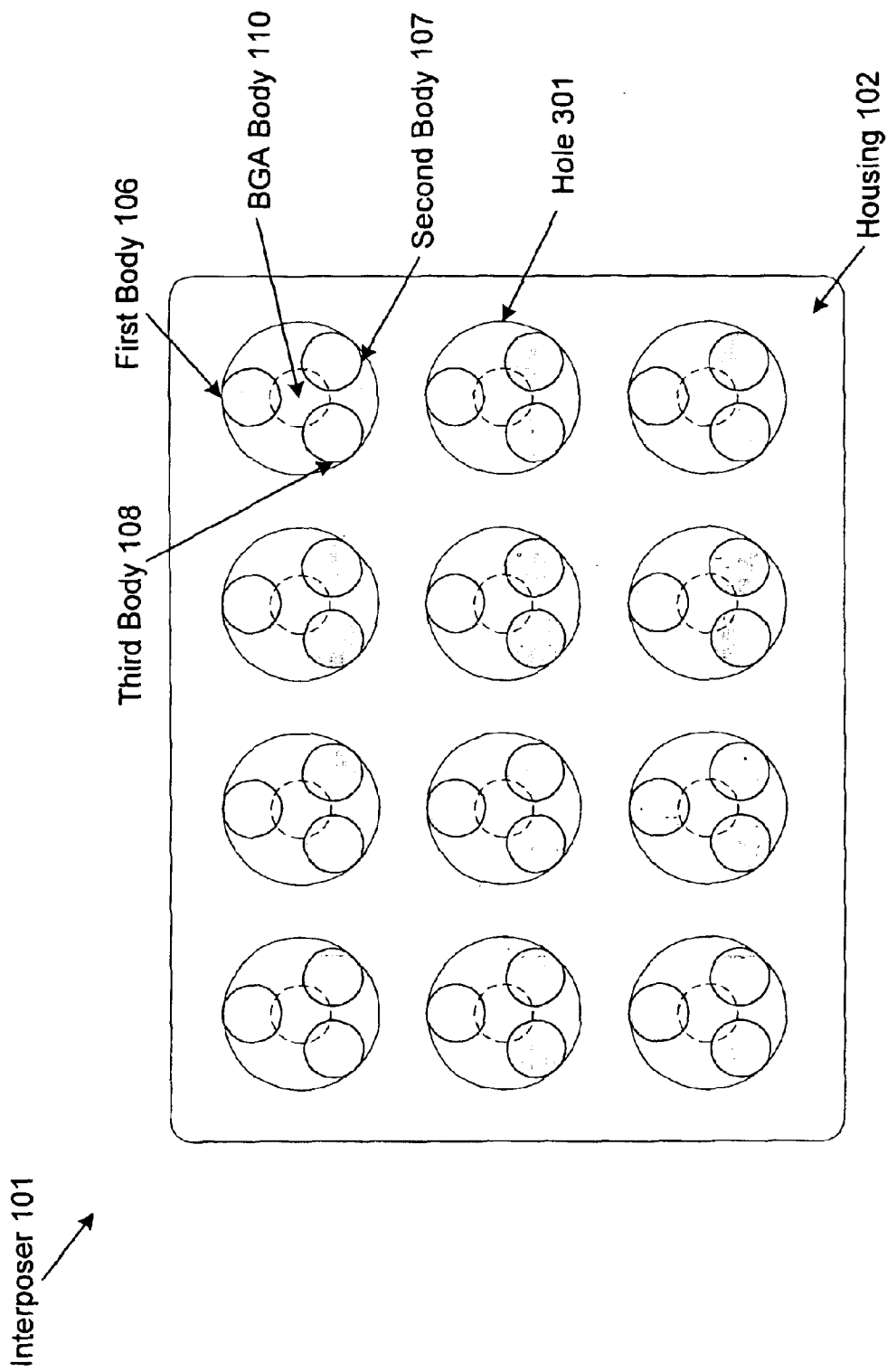
FIG. 3 is a plan view of the interposer, according to the invention.

FIG. 2 is an exploded view of interposer 101 and BGA connector 103, as discussed with reference to FIG. 1. Also, FIG. 3 is a plan view of interposer 101 as discussed with reference to FIG. 1. As more easily seen in FIGS. 2 and 3, first body 106, second body 107, and third body 108 may be located within a hole 301 in housing 102. The positioning of first body 106, second body 107, and third body 108 is such that BGA body 110 may rest upon first body 106, second body 107, and third body 108, prior to the reflow process. As a result, during and after the reflow process, BGA body 110 may be guided to be in contact with first body 106, second body 107, and third body 108, thus ensuring that BGA body 110 makes a proper soldered connection with at least one of first body 106, second body 107, and third body 108. Also, because the first end of contact 105 is in electrical contact with at least one of first body 106, second body 107, and third body 108, electrical conduction may be provided between BGA body 110 (and thus between BGA connector 103) and the second side of contact 105.

Figure 4:
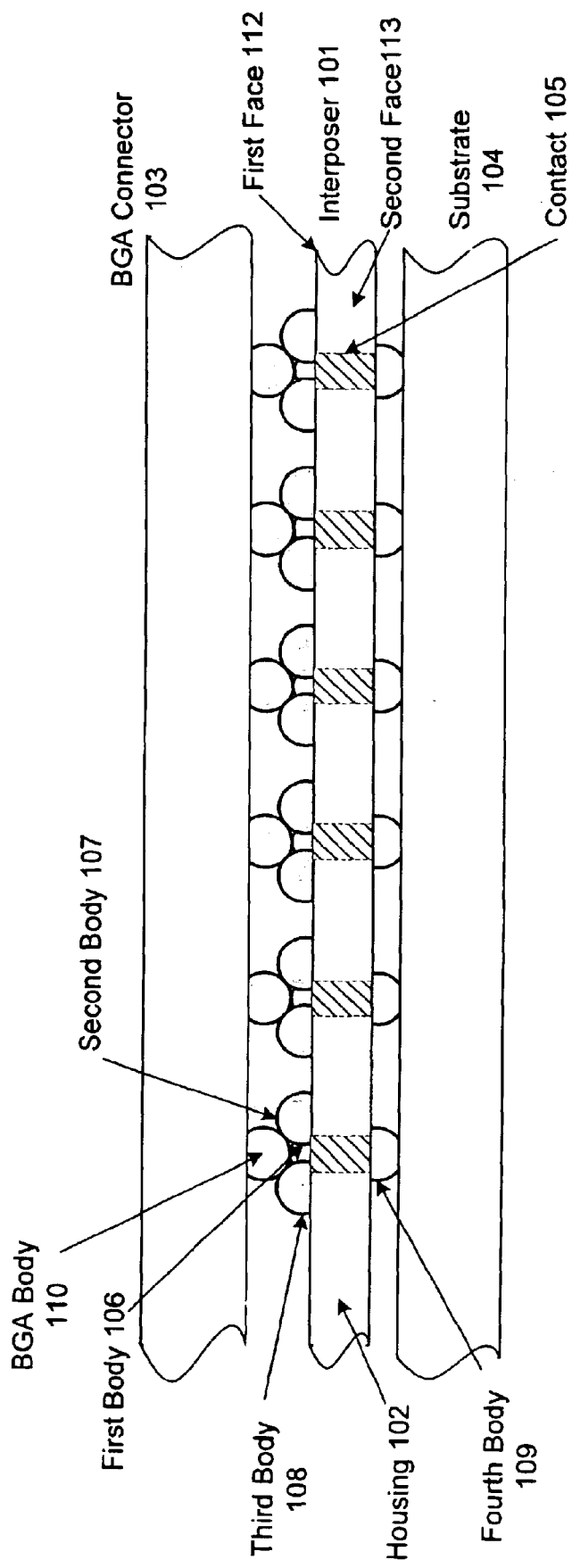
FIG. 4 is a side view of the interposer connected to the ball grid array connector, according to the invention.
Figure 5:
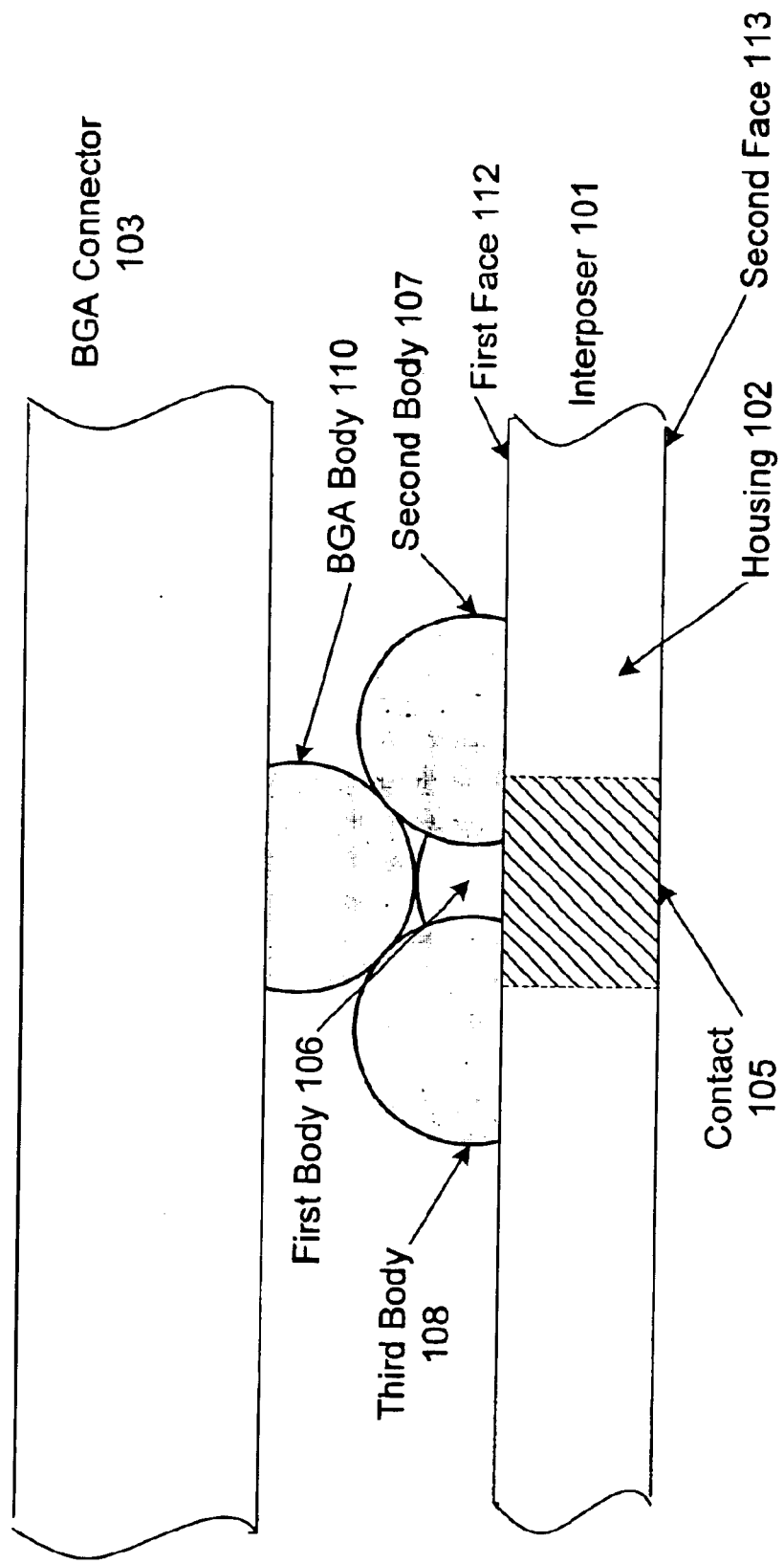
FIG. 5 is an exploded view of the interposer shown in FIG. 4, according to the invention.

FIG. 4 is a side view of interposer 101, BGA connector 103, and substrate 104 as discussed with reference to FIG. 1. FIG. 4 details BGA connector 103 and substrate 104 at rest on interposer 101 prior to the reflow process. FIG. 5 provides an exploded view of interposer 101 in electrical connection with BGA connector 103. As more clearly shown in FIGS. 4 and 5, BGA body 110 on BGA connector 103 makes physical contact with at least one of first body 106, second body 107, and third body 108, prior to the reflow process. As previously discussed, FIG. 4 also further details the electrical connection provided between BGA connector 103 and substrate 104 by bodies 106–109, 110 and contact 105 on interposer 101. In particular, following the reflow process, BGA connector 103 and interposer 101 are in electrical connection via a solderable connection made by BGA body 110 and first body 106, second body 107, and third body 108. Also, bodies 106–108 on first face 112 of interposer 101 are in electrical connection with contact 105, which is in further electrical connection with fourth body 109. Fourth body 109 makes electrical contact with contact pad 111 on substrate 104, such that after the reflow process electrical conduction may be provided from interposer 101 to substrate 104, and thus from BGA connector 103 to substrate 104.

Although FIGS. 1 through 5 have been discussed with reference to interposer 101, it should be appreciated that the invention equally applies to other connection devices. For example, the invention may apply to a BGA connector that may, for example, be in communication with another BGA connector. In this instance, the BGA connector may be constructed similar to interposer 101, and also include a second housing. The BGA connector may have a first face and a second face, such that the second face of the second housing is adapted to be removably connected to a second end of a contact on the ball grid array connector, similar to BGA connectors well known to those skilled in the art. Also, a second set of contacts may extend from the first face of the second housing, and a second body of material may be disposed on the first contact, so as to connect the BGA connector to a second substrate.

Figure 6:
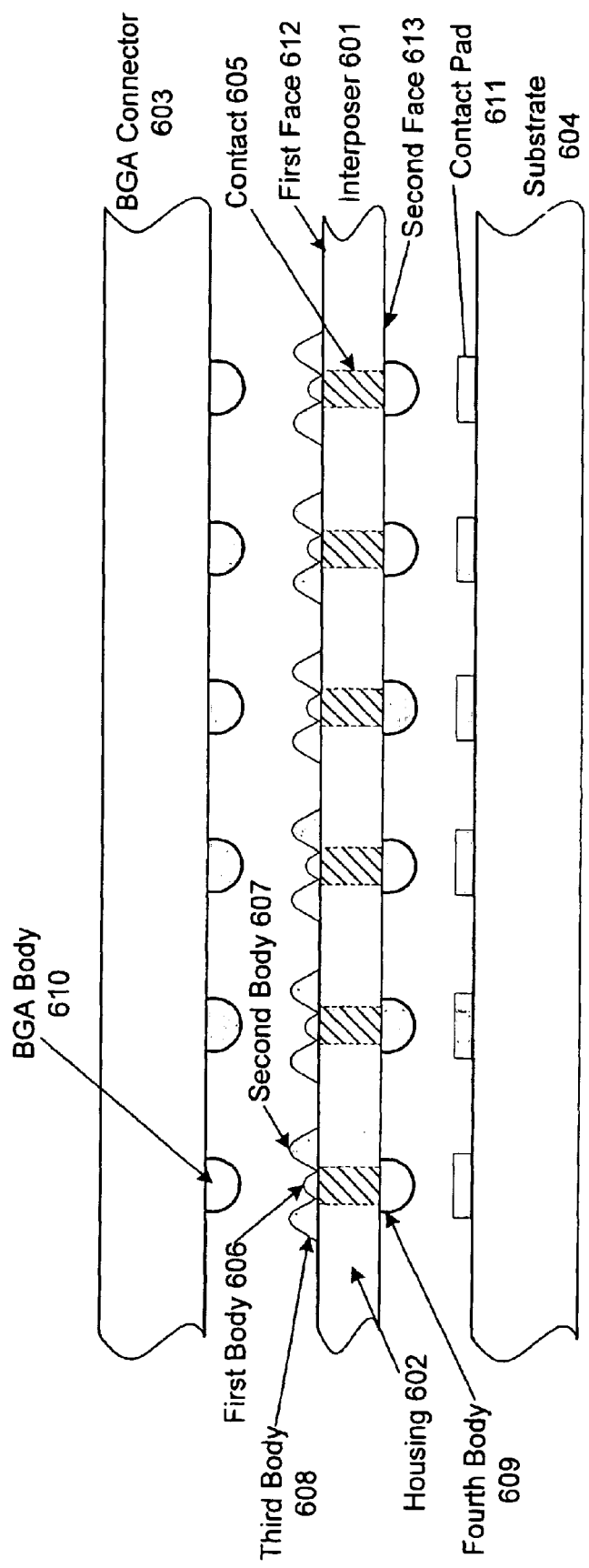
FIG. 6 is a side view of another interposer for a ball grid array connector, according to the invention.

FIG. 6 is a side view of another interposer 601 that provides electrical contact with a BGA connector 603. Interposer 601 is similar to interposer 101 as discussed with reference to FIGS. 1 through 5. Interposer 601, however, has a first body 606, a second body 607, and a third body 608 that have a substantially conical shape. Although the invention is not limited to any particular shape or dimension of first body 606, second body 607, and third body 608, the bodies may be spherical in shape so as to further permit BGA body 610 to rest in contact with each of bodies 606–608, prior to the reflow process. It follows, therefore, that during the reflow process, BGA body 610 is likely to make a soldered connection with at least one of first body 606, second body 607, and third body 608. As discussed with reference to interposer 101 in FIGS. 1 through 5, interposer 601 includes a contact 605 in electrical communication with first body 606, second body 607, and third body 608, and fourth body 609. It should be appreciated however, that contact 605 may not required.

Figure 7:
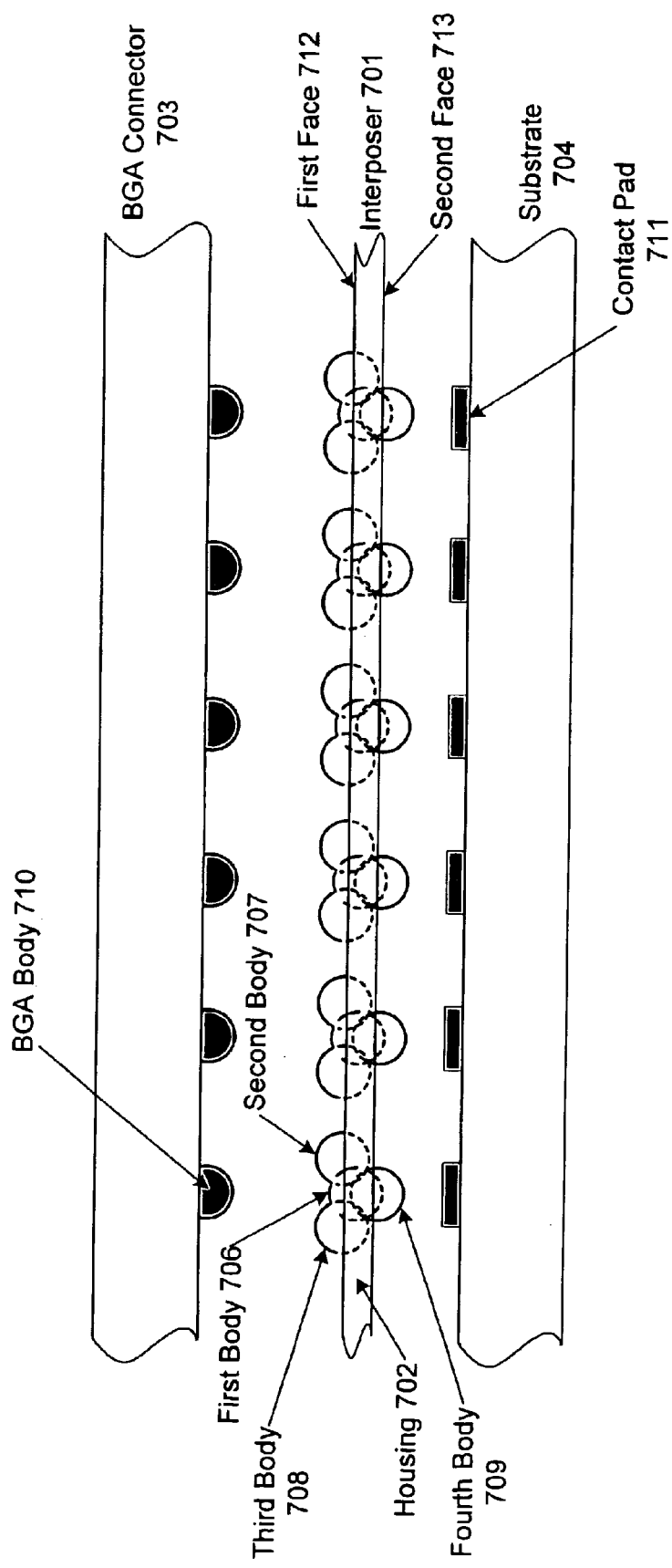
FIG. 7 is a side view of another interposer for a ball grid array connector, according to the invention.
Figure 8:
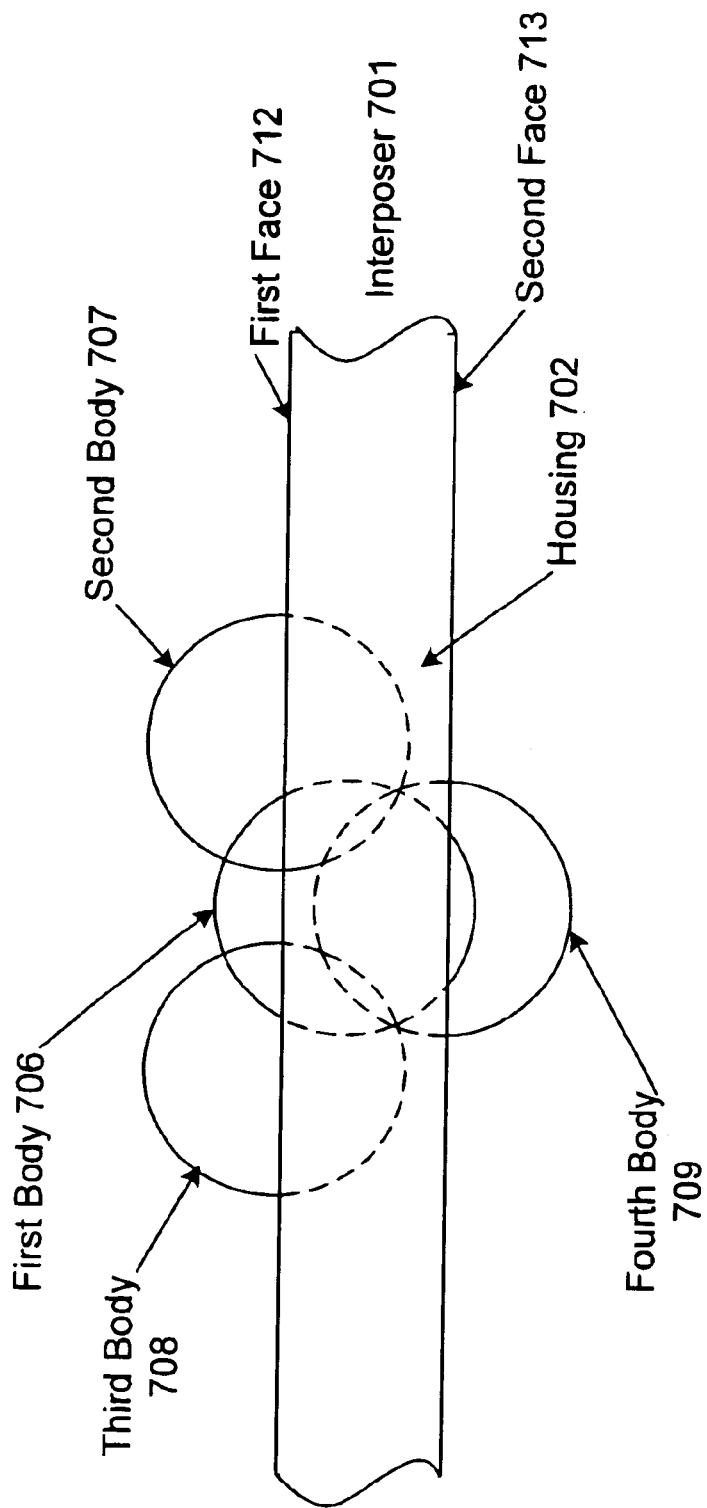
FIG. 8 is an exploded view of the interposer shown in FIG. 7, according to the invention.

FIGS. 7 and 8 provide a side view and exploded view, respectively, of another interposer 701. Interposer 701 is constructed such that a contact (e.g., contact 605 as discussed with reference to FIG. 6) is not required to provide electrical connection from first face 712 to second face 713 of housing 702. In particular, interposer 701 may allow first body 706, second body 707, and third body 708 to be in direct electrical connection with fourth body 709. Such direct electrical connection may be provided prior to the reflow process. Alternatively, such direct electrical connection may be provided during the reflow process by permitting fourth body 709 to be dimensioned such that it will rest in contact with first body 706, second body 707, and third body 708 prior to the reflow process. As with interposer 101 discussed with reference to FIGS. 1 through 5, and interposer 601 discussed with reference to FIG. 6, first body 706, second body 707, and third body 708 on first face of 712 of interposer 701 provide an interface such that BGA body 710 will rest on each of the bodies on first face 712, prior to the reflow process. As a result, interposer 701 provides an electrical connection from BGA connector 703 to substrate 704 via first body 706, second body 707, third body 708, and fourth body 709, without the need for a contact between the bodies of interposer 701. Also, fourth body 709 provides an electrical connection with contact pad 711.

Although three reflowable electrically conductive bodies are detailed on the first face of the interposer, it should be appreciated that any number of reflowable bodies may be disposed thereon. For example, it may be desirable for two such bodies, for example first body 106 and second body 107, to be disposed within hole 301 on housing 102. Also, for example, it may be desirable for four such reflowable electrically conductive bodies to be disposed on first face 112 of interposer 101. Accordingly, it should be appreciated that the invention is not limited to the number of reflowable electrically conductive bodies on interposer 101. Instead, interposer 101 may include any number of reflowable electrically conductive bodies as dictated by the device that is to be connected to interposer 101, for example, BGA connector 103.

It also should be appreciated that the contact need not be in electrical connection with the bodies disposed on the first face. For example, in one embodiment, contact 105 may be in electrical connection with first body 106, such that after the reflow process contact 105 is an electrical contact with second body 107, and third body 108 as a result of their solderable connection with first body 106. Also, it should be appreciated that any number of holes 301, and consequently any number of reflowable electrically conductive material within the holes, may be located on housing 102. For example, holes 301 may form a matrix array so as to provide an electrical connection with an array of ball grids, as with BGA connector 103.

The invention is directed to an electrical connection device for providing electrical contact with a BGA connector. It is noted that the foregoing examples have been provided merely for the purpose of explanation and are in no way to be construed as limiting of the invention. While the invention has been described with reference to certain embodiments, it is understood that the words that have been used herein are words of description and illustration, rather than words of limitation. For example, although the invention was described in the context of an interposer, it will be appreciated that the techniques and structure described may be equally applied to any type of electrical connector. Also, although the invention has been described with reference to certain components on the electrical connector, it should be appreciated that the configuration described is just one example of a configuration that is capable of providing such an inventive electrical connector. Accordingly, the invention contemplates any other electrical connector, not described in the specification that satisfies the example provided.

Further, although the invention has been described herein with reference to particular means, materials and embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects. Those skilled in the art will appreciate that various changes and adaptations of the invention may be made in the form and details of these embodiments without departing from the true spirit and scope of the invention as defined by the following claims.

What is claimed is:

1. An interposer for providing electrical contact with a ball grid array connector, comprising:

a housing having a plurality of contacts, wherein the contacts have a first end and a second end, and wherein the contacts pass from a first face of the housing to a second face of the housing opposite the first face;

a first body of reflowable, electrically conductive material disposed on the first end of at least one of the contacts; and a second body of reflowable, electrically conductive material disposed on the first end of at least one of the contacts, wherein the first body and the second body provide an electrical contact between the interposer and a single body of reflowable, electrically conductive material of the ball grid array connector.

2. The interposer of claim 1, wherein the first body and the second body form a soldered connection with the single body of reflowable, electrically conductive material of the ball grid array connector during a reflow process.

3. The interposer of claim 1, wherein the first end of the contacts are accessible on a first face of the housing and the second end of the contacts are accessible on an opposite face of the housing.

4. The interposer of claim 1, wherein the first body and the second body form a soldered connection with the single body of reflowable, electrically conductive material of the ball grid array connector during a reflow process.

5. The interposer of claim 1, wherein the interposer comprises a fourth body of reflowable, electrically conductive material disposed on the second end of at least one of the contacts that provides electrical contact between the interposer and a substrate during a reflow process, wherein the second end is opposite the first end.

6. The interposer of claim 1, further comprising a plurality of holes through the housing, wherein each hole has at least one contact therein.

7. The interposer of claim 1, wherein the contacts form a matrix array and each contact has at least first and second bodies for providing electrical contact between the interposer and respective single bodies of reflowable, electrically conductive material of the ball grid array connector.

8. The interposer of claim 1, wherein the interposer comprises a third body of reflowable, electrically conductive material disposed on the first end of at least one of the contacts, wherein the third body provides electrical contact between the interposer and the single body of reflowable, electrically conductive material of the ball grid array connector.

9. The interposer of claim 8, wherein at least one of the first, second, and third body form a soldered connection with the single body of reflowable, electrically conductive material of the ball grid array connector during a reflow process.

10. The interposer of claim 8, wherein the single body of reflowable, electrically conductive material of the ball grid array connector rests on the first, second, and third bodies of the interposer.

11. The interposer of claim 10, wherein the body of reflowable, electrically conductive material of the ball grid array connector, and the first, second and third bodies of the interposer are substantially spherical.

12. The interposer of claim 11, wherein the substantially spherical body of reflowable, electrically conductive material of the ball grid array connector rests on each of the substantially spherical first, second and third bodies of the interposer.

13. The interposer of claim 11, wherein the body of reflowable, electrically conductive material of the ball grid array connector, and the first, second and third bodies of the interposer have substantially similar dimensions.

14. The interposer of claim 10, wherein the body of reflowable, electrically conductive material of the ball grid array connector is substantially spherical, and at least one of the first, second and third bodies of the interposer are substantially conical.

15. The interposer of claim 14, wherein the substantially conical first, second and third bodies of the interposer have substantially similar dimensions.

16. The interposer of claim 14, wherein the substantially spherical body of reflowable, electrically conductive material of the ball grid array rests on each of the substantially conical first, second and third bodies of the interposer.

17. An electrical connection comprising, comprising:
a housing having a plurality of contacts, wherein the contacts have a first end and a second end, and wherein the contacts pass from a first face of the housing to a second face of the housing opposite the first face;
a first body of reflowable, electrically conductive material disposed on a first end of at least one of the contacts; and
a second body of reflowable, electrically conductive material disposed on the first end of at least one of the contacts,
wherein the first body and the second body form a soldered connection with a single body of reflowable, electrically conductive material during a reflow process.

18. The electrical connection of claim 17, wherein the first and second bodies are substantially spherical bodies having substantially similar dimensions.

19. The electrical connection of claim 17, wherein the first and second bodies are substantially conical bodies having substantially similar dimensions.

20. The electrical connection of claim 17, wherein the housing and the first and second bodies form part of an interposer and the other body forms part of a BGA connector.

21. An interposer for communicating with a ball grid array connector, comprising:
a housing having a plurality of holes;
more than one contact located within each of the plurality of holes, wherein the contacts have a first end and a second end;
a first body of reflowable, electrically conductive material disposed on the first end of a first contact; and
a second body of reflowable, electrically conductive material disposed on the first end of a second contact, wherein the first body and the second body provide an electrical contact between the interposer and a single body of reflowable, electrically conductive material of the ball grid array connector.

22. The interposer of claim 21, further comprising a third body of reflowable, electrically conductive material disposed on the second end of at least one of the first and second contacts.

23. An interposer for mating with a ball grid array connector, comprising:
a housing having a first face and a second face, wherein the first face is opposite the second face;
a plurality of holes in the housing extending from the first face to the second face;
a first body of reflowable, electrically conductive material located partially within a first hole, wherein the first body extends from a plane of the first face; and
a second body of reflowable, electrically conductive material located partially within the first hole, wherein the second body extends from a plane of the first face.

24. The interposer of claim 23, further comprising a third body of reflowable, electrically conductive material located partially within the first hole, wherein the third body extends from a plane of the first face.

25. The interposer of claim 23, further comprising a fourth body of reflowable, electrically conductive material located partially within the first hole, wherein the third body extends from a plane of the second face.

26. The interposer of claim 25, wherein the fourth body is in electrical connection with at least one of the first, second, and third bodies.

* * * * *